United States Patent [19]
Seo

[11] Patent Number: 4,987,325
[45] Date of Patent: Jan. 22, 1991

[54] MODE SELECTING CIRCUIT FOR SEMICONDUCTOR MEMORY DEVICE

[75] Inventor: Seong-Mo Seo, Seoul, Rep. of Korea

[73] Assignee: SamSung Electronics Co., Ltd., Kyung Ki-Do, Rep. of Korea

[21] Appl. No.: 379,240

[22] Filed: Jul. 13, 1989

[30] Foreign Application Priority Data

Jul. 13, 1988 [KR] Rep. of Korea ................ 88-8700[U]

[51] Int. Cl.$^5$ ......................................... H03K 17/693
[52] U.S. Cl. .................................... 307/465; 307/451; 307/469; 365/230.01
[58] Field of Search ..................... 307/202.1, 451, 465, 307/468, 469, 272.1; 365/225.7, 230.1, 230.6, 189.3

[56] References Cited

U.S. PATENT DOCUMENTS

| 4,532,607 | 7/1985 | Uchida | 307/202.1 X |
| 4,546,455 | 10/1985 | Iwahashi et al. | 307/202.1 X |
| 4,571,707 | 7/1986 | Watanabe | 307/202.1 X |
| 4,621,346 | 11/1986 | McAdams | 365/225.7 |
| 4,689,494 | 8/1987 | Chen et al. | 307/202.1 |
| 4,721,868 | 1/1988 | Cornell et al. | 307/465 |
| 4,808,844 | 2/1989 | Ozaki et al. | 307/465 X |
| 4,833,650 | 5/1989 | Hirayama et al. | 365/225.7 |
| 4,835,414 | 5/1989 | Freidin | 307/465 X |

Primary Examiner—David Hudspeth
Attorney, Agent, or Firm—Robert E. Bushnell

[57] ABSTRACT

Disclosed is a mode selecting circuit for semiconductor memory device having one or more mode selection signal generating means. Each mode selection signal generating means consists of an inverter means for inverting a reset signal; a mode selector using connecting means between a first power source terminal and a node coupled with the output terminal of the inverter and formed during the manufacturing process; a first latch for latching a low or high signal depending on the circumstance; an output buffer; and a reset signal generator for generating reset signals in synchronization with the leading edge of a chip enable signal, and for delivering the reset signals to the respective mode selection signal generator. The circuit according to the present invention is simple and convenient in design, thereby shortening the turn around time of the memory device. Further, it promises exact and correct circuit operations, and makes it possible to reduce the manufacturing cost. The manufacturer can also furnish diversified options in order to meet the requirements of users.

20 Claims, 3 Drawing Sheets

MODE SELECTING CIRCUIT FOR SEMICONDUCTOR MEMORY DEVICE

FIELD OF THE INVENTION

The present invention relates to a mode selecting circuit for semiconductor memory device, and particularly to a mode selecting circuit for semiconductor device, in which various operational mode options are provided, and in which variation and selection of various modes other than the basic operational mode are made possible in diversified ways.

BACKGROUND OF THE INVENTION

Various new operational modes other than the basic operational mode are developed in semiconductor memory devices such as DRAM, according as such semiconductor devices reach increased memory capacities such as 1 mega bits or 4 mega bits. In the currently available 1 mega DRAM or 4 mega DRAM, the modes are classified into X1 mode, X4 mode and the like based on the number of output data, while they are also classified, for example, into page mode, nibble mode, station column mode, write per bit mode and the like based input control signals. Therefore, In order to meet the requirements of users, the manufacturer of DRAM provides makes the various modes other than the basic operational mode optional in the manufacturing process, so that the selected modes can be used by users. Thus the manufacturer supplies DRAMs having diversified functions in correspondence with the various modes selected.

In the conventional techniques, the provision of certain mode options is carried out in such a manner that, at the final step of the manufacturing process, either different metal masks are used, or wire-bondings are done in different ways, or the fuse is broken, thereby selecting a particular mode or modes.

However, in such an option-provided conventional equipment, in which the metal masks, the wire bondings or the fuse is separately handled, diversified options can not be provided, and therefore, a number of modes has to be designed from the initial developing step. This caused the phenomenon that the turn around time is extended, and that the manufacturing cost is increased.

SUMMARY OF THE INVENTION

The present invention is intended to overcome the disadvantages of the conventional technique.

Therefore, it is an object of the present invention to provide a mode selecting circuit for semiconductor memory devices which can be manufactured repeatedly by using a unit circuit design.

It is another object of the present invention to provide a mode selecting circuit for semiconductor device which is helpful for shortening the turn around time of the memory device.

In achieving the above objects, the circuit according to the present invention includes one or more of mode selection signal generating means constituted as follows. Each mode selection signal generating means contains an inverter for inverting the a reset signal, a mode selector for determining, during the chip manufacturing process, the connection between a first power source terminal and an inverter output node to which the inverter is connected, a first latch for latching the low signals when the first power source terminal is connected to the inverter output node, and for latching high signals by means of an inverted reset signal which is initially delivered when the first power source terminal is not connected to the inverter output, and an output buffer for buffering the output of the latch, and the output resistance of the inverter being sufficiently larger than that of the mode selector so as to keep the inverter output node in high stage regardless of the operation of the inverter means in response to said reset signal when the first power source terminal is connected to said node.

The mode selecting circuit according to the present invention includes, in addition, a reset signal generator for generating reset signals and for delivering them to the respective mode selection signal generator in synchronization with the leading edge of the incoming chip enable signal.

The inverter uses of a first NMOS transistor having a gate receiving the reset signals through a delay, a source coupled with a second power source terminal, and a drain coupled with the inverter output node.

The mode selector is provided with metal wiring a fuse and a bonding pad, the metal wiring and fuse being connected in series through a switching stage between the first power source terminal and the inverter output node, and the bonding pad being connected by means of a wire bonding to the lead frame of the second power source terminal.

The switching stage is operated in such a manner that it is kept in a turn-on state owing to the initially supplied reset signal so long as the second power source is not applied lo the bonding pad, while it is kept in a turn-off state regardless of the reset signal if the power source is applied.

The switching stage uses a second PMOS transistor having a source connected through the metal wiring to the first power source terminal, a drain connected through the fuse to the inverter output node, and a gate connected through a second latch to the bonding pad. The second PMOS transistor has a geometrical size sufficiently larger than that of the first NMOS transistor of the inverter so as to keep the inverter output node in high state regardless of the operation of the inverter means in response to said reset signal when the first power source terminal is connected to said node. The gate of the second PMOS transistor is connected to the drain of a third NMOS transistor, the gate of which receives the reset signals, and the source of which is connected to the second power source terminal.

The second latch uses a fourth NMOS transistor having a drain connected to the first power source terminal, a source connected to an input node coupled with the bonding pad, and a gate connected through the inverter to an output node; a fifth NMOS transistor having a drain connected to the input node, a source connected to the second power source terminal, and a gate connected to the output node: a sixth PMOS transistor having a source connected to the first power source terminal, a drain connected to the output node, and a gate connected to the input node; and a seventh NMOS transistor having a drain connected to the output node, a source connected to the second power source terminal, and a gate connected to the input terminal, characterized in that the geometrical size of the sixth PMOS transistor is sufficiently larger than the sum of the geometrical sizes of the third and seventh NMOS transistors so as to keep the second PMOS transistor in off state regardless of the turn-on state of the second NMOS transistor in response to said reset signal when the second power source voltage is supplied to said bonding pad.

The first latch has an eighth NMOS transistor having a drain connected to an input node coupled with the inverter output node, a gate connected to an output node, and a source connected to the second power source terminal; a ninth PMOS transistor having a source connected to the first power source terminal, a drain connected to the output node, and a gate connected to the input node; and a tenth NMOS transistor having a drain connected to the output node, a source connected to the second power source terminal, and a gate connected to the input node.

Another embodiment of the mode selector according to the present invention can be made to consist of a fuse and/or metal wiring connected between the first power source terminal and the inverter output node.

In the second embodiment, the inverter uses of a first NMOS transistor having a gate receiving reset signal through a delay, a drain coupled with the inverter output node, and a source coupled with the second power source terminal. The mode selector uses of a second PMOS transistor in which the source is connected to the first power source terminal, the drain is connected to the inverter output node, and the gate is connected through the second latch to the bonding Dad which is connected through a wire bonding to the lead frame for connecting the second power source terminal.

The second PMOS transistor is also characterized in that its geometrical size is sufficiently larger than that of the first NMOS transistor of the inverter so as to keep the inverter output node in high state regardless of the operation of the inverter means in response to said reset signal when the first power source terminal is connected to said node, and that its gate is connected lo the drain of a third NMOS transistor in which the gate receives the reset signals, and the source is connected to the second power source terminal.

The switching stage is also constituted such that it is kept in a turn-on state by means of the initially supplied said reset signal so long as the second power source is not applied, while it is kept in a turn-off state regardless of the reset signal when the second power source is applied.

BRIEF DESCRIPTION OF THE DRAWINGS

The above objects and other advantages of the present invention will become more apparent by describing the preferred embodiments of the present invention with reference to the attached drawings in which.

DESCRIPTION OF THE PREFERRED EMBODIMENTS

Figure 1:
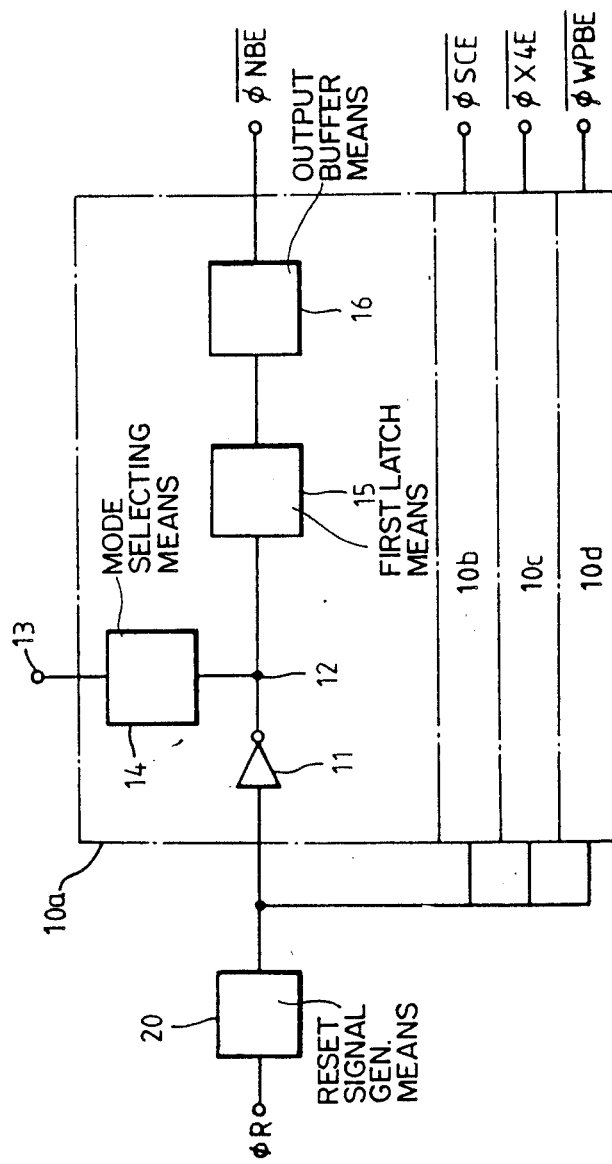
FIG. 1 is a block diagram of the circuit according to the present invention.

FIG. 1 is a block diagram of the circuit of the present invention. In FIG. 1, a plurality of mode selection signal generators 10a-10d are commonly connected to reset signal generator 20. The mode selection signal generators 10a, 10b, 10c, 10d respectively generate nibble mode selecting signals $\phi\overline{NBE}$, static column mode selecting signals $\phi\overline{SCE}$, X4 mode selecting signals $\phi\overline{X4E}$, and write per bit mode selecting signals $\phi\overline{WPBE}$. The reset signal generator 20 generates reset signal which are synchronized with the leading edge of the outer chip selecting signal. The plurality of mode selection signal generators have the same circuital constitution one another. The mode selection signal generator 10a uses an inverter 11, a mode selector 14 connected between the a first power source terminal 13 and an inverter output node 12, a first latch 15 for latching tho signals to the inverter output node 12, and an output buffer 16 for buffering the output of first latch 15.

The mode selector 14 is constituted such that certain modes are selected or not depending on whether the inverter output node 12 is connected to the first power source terminal 13.

The first latch 15 is constituted such that it carries out the latching of the mode selecting signal by means of a reset signal which is initially input under a state in which the first power source voltage is not applied to the inverter output node.

Figure 2:
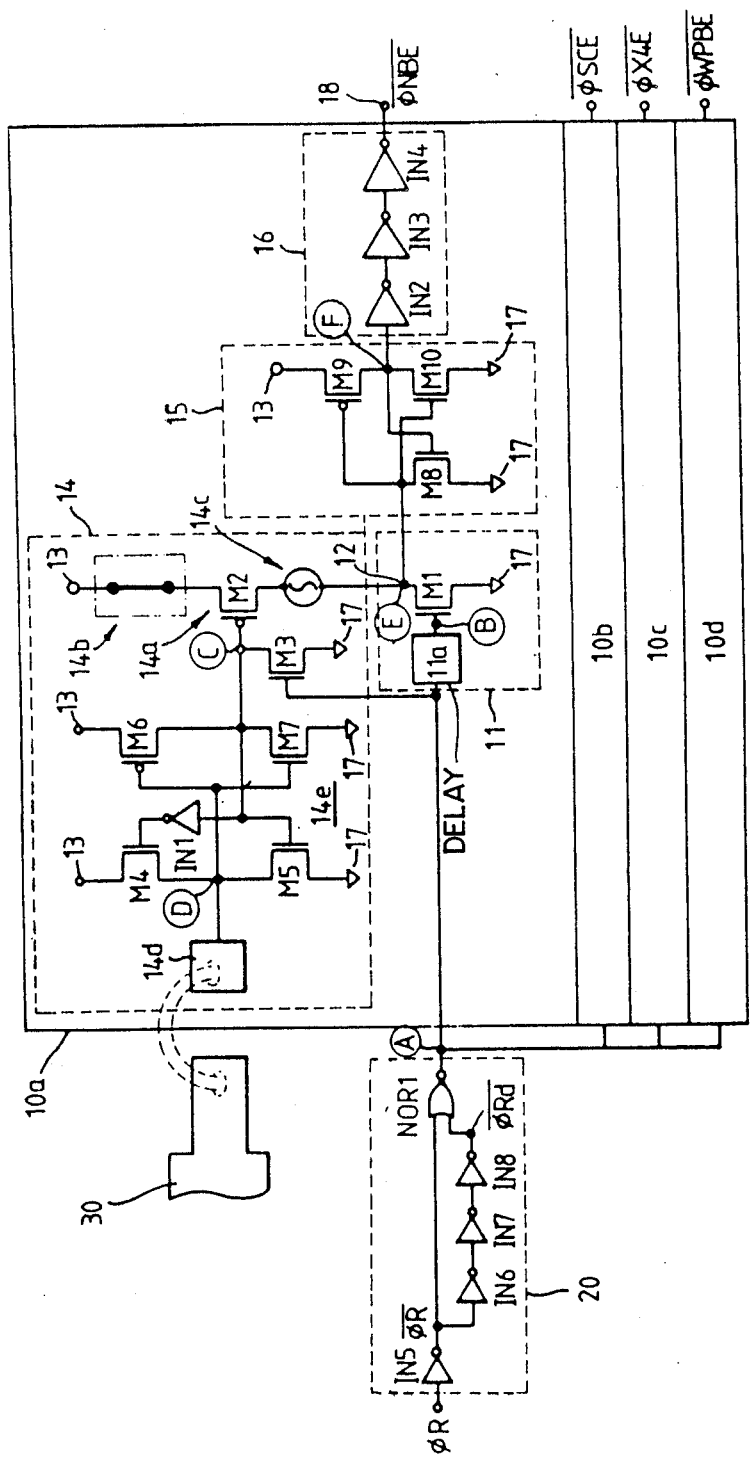
FIG. 2 is the illustration of a circuit for an embodiment of the present invention.

FIG. 2 is an illustration of a circuit for a preferred embodiment of the present invention. In this drawing, the inverter 11 user a first NMOS transistor M1 having a gate receiving reset signal through a delay 11a, a source coupled with a second power source terminal 17, and a drain coupled with the inverter output node 12.

Mode selector 14 is provided with a metal wiring 14b and a fuse 14c which are interconnected in series through a switching stage 14a between the first power source terminal 13 and the inverter output node 12, and mode selector 14 is further provided with a bonding pad 14d which is connected by means of a wire bond to a lead frame 30 for connecting the second power source terminal 17. Further, selector 14 is characterized in that it is kept in a turn-on state by means of the initially supplied reset signal so long as the second Dower source voltage is not supplied to the bonding pad 14d, and is kept in a turn-off state regardless of the reset signal when the power source is supplied.

The switching stage 14a includes of a second PMOS transistor M2 having a source connected through the metal wiring 14b to the first power source terminal 13, a drain connected through the fuse 14c to the inverter output node 12, and a gate connected through a second latch 14e to the bonding pad 14d. The second NMOS transistor M2 has a geometrical size sufficiently larger than that of the first NMOS transistor M1 of the inverter means 11 so as to keep the inverter output node in high state regardless of the operation of the inverter means in response to said rest signal when the first power source terminal is connected to said node, and the gate of the second PMOS transistor M2 is also connected to the drain of a third NMOS transistor MS which has a gate receiving the reset signal, and a source connected to the second power source terminal.

The second latch 14e uses a fourth NMOS transistor M4 having a drain connected to the first Dower source terminal 1S, a source connected to an input node coupled with bonding pad 14d, and a gate connected through an inverter IN1 to an output node a fifth NMOS transistor M6 having a drain connected to the input node, a source connected to the second power source terminal 17, and a gate connected to the output node a sixth PMOS transistor M6 having a source connected to the first power source terminal 13, a drain connected to the output node, and a gate connected to the input node; and a seventh NMOS transistor M7 having a drain connected to the output node, a source connected to the second power source terminal, and a gate connected to the input node, characterized in that the geometrical size of the sixth PMOS transistor M6 is sufficiently larger than the sum of the geometrical sizes of the third and seventh NMOS transistors M3, M7 so as to keep the second PMOS transistor in off state regardless of the turn-on state of the second NMOS transistor in response to said reset signal when the second power source voltage is supplied to said bonding pad.

The first latch means 15 uses an eighth NMOS transistor M8, a ninth PMOS transistor M9 and a tenth NMOS transistor M10, the eighth NMOS transistor M8 having a drain connected to an input node coupled with the inverter output node 12, a source connected to the second power source terminal 17, and a gate connected to an output node: the PMOS transistor M9 having a source connected to the first power source terminal 13, a drain connected to the output node, and a gate connected to the input node: and the tenth NMOS transistor M10 having a drain connected to the output node, a source connected to the second power source terminal 17, and a gate connected to the input terminal.

The output node of the first latch means 15 is connected through the output buffer means 16, i.e., three serially connected inverters IN1-IN3 to an output terminal 18.

The reset generator 20 is constituted such that the received chip selecting signal $\phi R$ is inverted through an inverter IN5 to the signal $\overline{\phi R}$ is applied to one of the input terminals of a NOR gate NOR1, and the output signal of the inverter IN5 is delayed through three serial-connected inverters IN6-IM8 to form a signal $\phi Rd$ which is applied to another input terminals of the NOR gate NOR1, so that a reset signal A should be generated in synchronization with the leading edge of the chip selecting signal $\phi R$.

Now the circuit according to the present invention constituted as above will be described as to its action and effect.

Figure 3:
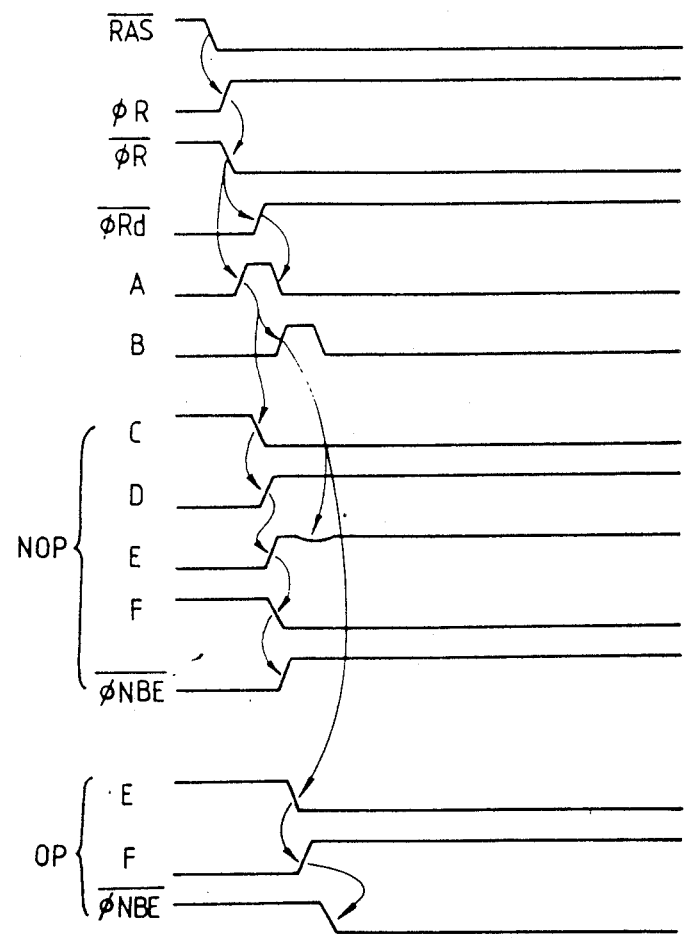
FIG. 3 is the time chart illustrating the operations of the essential parts of FIG. 2 under the non-option mode and the option mode.

FIG. 3 illustrates the wave patterns of the different portions of FIG. 2.

First, in the case of the non-option, a description will be made for the case where the bonding pad 14d is not connected to the lead frame, under the condition that the metal wiring 14b and the fuse 14c of the mode selection signal generator 10a are connected. The inner chip selecting signal $\phi R$ of memory device such as DRAM is shifted from a low state to a high state at the leading edge of the row address strobe signal $\overline{RAS}$ This inner chip selecting signal $\phi R$ is supplied to the reset generator 20, and the reset generator 20 generates a reset signal A which is provided with a predetermined pulse width by the inverters IN6-IN8. Referring to the five non-option signals NOP in FIG. 3, the third NMOS transistor M3 is turned on at the ascending edge of the reset signal, and therefore the output node of the second latch 14e is shifted to a low state at the descending edge of a source output C. Therefore, this low signal turns on the fourth NMOS transistor M4 through the inverter IN1, and the drain output of the fourth NMOS transistor M4 turns on the seventh NMOS transistor M7, thereby keeping the output node of the second latch 14e at a low state.

Accordingly the switching stage 14a, i.e., the second PMOS transistor M2 is kept in a turned-on position, and therefore, the inverter output node 12 is kept continuously at a high state, regardless of a delayed reset signal B which is supplied to the inverter 11.

Due to this high signal, the tenth NMOS transistor M10 of the first latch 15 is kept in a turn-on state, thereby keeping the output terminal 18 at the high state. That is, if the wire bonding is not fitted to the bonding pad, the output of the mode selection signal generator 10a is kept in a high state in synchronization with the chip selecting signal, with the result that a mode selecting signal, i.e., the nibble mode selecting signal $\phi \overline{NBE}$ is not generated.

Meanwhile, in the case where options are provided, the provision of the options is carried out through a wire bonding process or, a metal mask or fuse cutting process First, in the case of the wire bonding process, a predesigned bonding pad is connected to the lead frame 30 through the wire bonding process, thereby establishing the option modes. That is, the lead frame 30 to which the second power source terminal 17 is connected is also connected to the bonding pad 14d, and therefore, a low signal is applied to the input node of the second latch 14e, so that the output node of the second latch 14e should be latched to a high state due to the turning-on of the sixth PMOS transistor. Since the geometrical size of the sixth PMOS transistor M6 is designed larger than the sum of the geometrical sizes of the third and seventh NMOS transistors, the second PMOS transistor M2 is kept in a turn-off state regardless of the turning-on of the third NMOS transistor M3 by means of a reset signal. Therefore, the supply of the first power source voltage is disconnected from the inverter output node 12.

Therefore as indicated by the last three option waveforms OP in FIG. 3, a low signal E is supplied to the input node of the first latch 15 at the ascending edge of the delayed reset signal B, while the output node of the first latch means 16 is shifted to a high state F due to the turn-on of the ninth PMOS transistor M9. Therefore, the output terminal 1B will generate a mode selecting signal of a low level, i.e., the nibble mode selecting signal $\phi \overline{NBE}$ through the output buffer 16.

Meanwhile, if the metal wiring 14b based on the metal mask is omitted, or if the fuse is out off (i.e., if fuse 14b is open), then the mode selecting signal is generated owing to the reset signal like in the case where the wire bonding is carried out.

According to the present invention, the mode selections can be achieved by means of the mode selector 14, that is, by disconnecting the fuse 14c or the metal wiring 14b between the first power source terminal 13 and the inverter output node 12 of the inverter 11.

Further, the mode selector 14 can be constituted in such a manner that the mode selection can be achieved by providing a second PMOS transistor between the inverter output node 12 and the first power source terminal 13, that is by turning on or off the transistor, without providing the metal wiring 14b or the fuse 14c.

As described above, the mode selection signal generator is provided for each operational mode so that operational modes other than the basic operational mode of the memory device should be available. These code selection signal generator are all constituted in the same manner, and therefore, they can be provided in a repetitive manner, with the result that the design of the circuit is simple and convenient, thereby making it possible to shorten the turn around time of the memory device.

Further, the mode selection is resetted in synchronization with the chip selecting signal, and therefore, exact and correct circuit operations can be expected.

Further, the simplification of the circuit design makes it possible to save the manufacturing cost, and the manufacturer can furnish diversified options in Order to meet the requirements of users.

What is claimed is:

1. A mode selecting circuit for semiconductor memory device, comprising one or more mode selection signal generating means, each of said mode selection signal generating means having:

inverter means for inverting a reset signal;

mode selecting means for determining, during a chip manufacturing process, the connection between a first power source terminal and an inverter output node coupled with an output terminal of the inverter means the output resistance of said inverter means being sufficiently larger than that of said mode selecting means so as to keep the inverter output node in a high state regardless of the operation of the inverter means in response to said reset signal when the first power source terminal is connected to said node;

first latch means for latching a low signal when said first power source terminal is connected to said inverter output node, and for latching a high signal by means of an initially supplied and inverted said reset signal when said first power source terminal is not connected to said inverter output node; and output buffer means for buffering the output of said first latch means.

2. A mode selecting circuit according to claim 1, further comprising reset signal generating means for generating said reset signal in synchronization with the leading edge of a chip enable signal supplied from the exterior of said semiconductor memory device, and for delivering said reset signal to a corresponding one of said mode selection signal generating means.

3. The mode selecting circuit as claimed in claim 1, wherein:

said inverter means comprises a first NMOS transistor having a gate receiving said reset signal through a delay means, a source coupled with a second power source terminal, and a drain coupled with said inverter output node;

said mode selecting means is provided with a metal wiring and a fuse interconnected in series through switching means between said first power source terminal and said inverter output node, and is also provided with a bonding pad may be connected via a wire bonding and a lead frame to said second power source terminal; and said switching means is constituted in such a manner that said switching means is kept in a turn-on state owing to an initially supplied said reset signal so long as a second power source is not applied, and said switching means is kept in a turn-off state regardless of said reset signal when the second power source is applied.

4. The mode selecting circuit as claimed in claim 3, wherein said switching means comprises:

a second PMOS transistor having a source connected through said metal wiring to the first power source terminal, a drain connected through said fuse to said node, and a gate connected through a second latch means to said bonding pad;

the geometrical size of said second PMOS transistor being sufficiently larger than the geometrical size of the first NMOS transistor so as to keep the inverter output node in said high state regardless of the operation of the inverter means in response to said reset signal when the first power source terminal is connected to said node of said inverter means; and a third NMOS transistor, the gate of said second PMOS transistor being also connected to the drain of said third NMOS transistor, a gate of said third NMOS transistor being coupled to receive said reset signal, and a source of said third NMOS transistor being connected to the second power source terminal.

5. The mode selecting circuit as claimed in claim 1, wherein said second latch means comprises:

a fourth NMOS transistor having a drain connected to the first power source terminal, a source connected to an input node coupled with said bonding pad, and a gate connected through the inverter to an output node;

a fifth NMOS transistor having a drain connected to said input node, a source connected to the second power source terminal, and a gate connected to the output node;

a sixth PMOS transistor having a source connected to the output node, and a gate connected to the input node; and a seventh NMOS transistor having a drain connected to the output node, a source connected to the second power source terminal, and a gate connected to the input node;

characterized in that the geometrical size of said sixth PMOS transistor is sufficiently larger than the sum of the geometrical sizes of the third and seventh NMOS transistors so as to keep the second PMOS transistor in an OFF state regardless of the turn-on state of the second NMOS transistor in response to said reset signal when the second power source voltage is supplied to said bonding pad.

6. The mode selecting circuit as claimed in claim 1, wherein said first latch means comprises:

an eighth NMOS transistor having a drain connected to an input node coupled with said inverter output node, a source connected to the second power source terminal, and a gate connected to an output node;

a ninth PMOS transistor having a drain connected to said output node, a source connected to the first power source terminal, and a gate connected to said input node; and a tenth NMOS transistor having a drain connected to said output node, a source connected to the second power source terminal, and a gate connected to said input node.

7. The mode selecting circuit as claimed in claim 6, wherein said mode selecting means comprises a fuse and metal wiring formed by means of a metal mask, said fuse and metal wiring being interconnected in series between said inverter output node and the first power source terminal.

8. The mode selecting circuit as claimed in claim 1, wherein said mode selecting means consists of a fuse and metal wiring formed by means of a metal mask, said first metal wiring being connected between said inverter output node and the first power source terminal.

9. The mode selecting circuit as claimed in claim 6, wherein:

the inverter means comprises a first NMOS transistor having a gate receiving the reset signal through the delay means, a source coupled with the second power source terminal, and a drain coupled with said node;

said mode selecting means comprises a second PMOS transistor having a source connected to the first power source terminal, a drain connected to said inverter output node, and a gate connected through the second latch means to bonding pad and, by means of a wire bonding, to a lead frame for connecting the second power source terminal;

said second PMOS transistor is characterized in that the geometrical size is sufficiently larger than the geometric size of the first NMOS transistor of said inverter means so as to keep the inverter output node in said high state regardless of the operation of the inverter means in response to said reset signal when the first power source terminal is connected to said node;

a third PMOS transistor, the gate of said second PMOS transistor being connected to a drain of the third NMOS transistor, said third PMOS transistor having a gate receiving said reset signals, and a source connected to the second power source terminal; and said switching means being characterized in that said switching means is kept in a turn-on state owing to said reset signal so long as the second power source voltage is not applied, and said switching means is kept in a turn-off state regardless of the reset signal when the second power source voltage is applied.

10. A mode selection signal generating circuit, comprising:
inverter means providing an output terminal, for inverting and delaying a supplied reset signals;
mode selecting means for determining the connection between a first power source terminal and an inverter output node coupled with the output terminal of the inverter means, output resistance of said inverter means being larger than output resistance of said mode selecting means; and
first latch means for latching a first logic signal when the first power source terminal is connected to said inverter output node, and for latching a second logic signal by means of an initially supplied and delayed said reset signal when said first power source terminal is not connected to said inverter output node.

11. The mode selection signal generating circuit of claim 10, wherein said inverter means comprises a first MOS transistor having a gate electrode coupled to receive said reset signals, and source and drain electrodes coupled between a second power source terminal and said inverter output node.

12. The mode selection signal generating circuit of claim 10, wherein said mode selecting means comprises:
a first MOS transistor having source and drain electrodes disposed between said first power source and said inverter output node;
first means for providing, and for interrupting, an electrical connection between one of said source and drain electrodes of said first MOS transistor and said first power source;
second means for providing, and for interrupting, a second electrical connection between the other of said source and drain electrodes of said first MOS transistor and said inverter output node; and
a second MOS transistor having source and drain electrodes coupled between a gate electrode of said first MOS transistor and a second power source terminal.

13. The mode selection signal generating circuit of claim 11, wherein said mode selecting means comprises:
a second MOS transistor having source and drain electrodes disposed between said first power source and said inverter output node;
first means for providing, and for interrupting, an electrical connection between one of said source and drain electrodes of said second MOS transistor and said first power source;
second means for providing, and for interrupting, a second electrical connection between the other of said source and drain electrodes of said second MOS transistor and said inverter output node; and
a third MOS transistor having source and drain electrodes coupled between a gate electrode of said second MOS transistor and said second power source terminal.

14. The mode selection signal generating circuit of claim 10, wherein said mode selecting means comprises:
a first MOS transistor having source and drain electrodes disposed between said first power source and said inverter output node;
first means for providing, and for interrupting, an electrical connection between one of said source and drain electrodes of said first MOS transistor and said first power source;
second means for providing, and for interrupting, a second electrical connection between the other of said source and drain electrodes of said first MOS transistor and said inverter output node;
a second MOS transistor having source and drain electrodes coupled between a gate electrode of said first MOS transistor and a second power source terminal;
a third MOS transistor having source and drain electrodes coupled between said first power source terminal and an input node;
an inverter coupled between a gate electrode of said third MOS transistor and said gate electrode of said first MOS transistor;
a fourth MOS transistor having source and drain electrodes coupled between said input node and said second power source terminal;
a fifth MOS transistor having source and drain electrodes coupled between said first power source terminal and said gate electrode of said first MOS transistor, and a gate electrode coupled to said input node;
a sixth MOS transistor having source and drain electrodes coupled between said gate electrode of said first MOS transistor and said second power source terminal, and a gate electrode coupled to said input node; and
third means for providing, and for interrupting, a third electrical connection between said input node and said second power source terminal.

15. The mode selection signal generating circuit of claim 11, wherein said first latch means includes means coupled to said gate electrode of said first MOS transistor for delaying said reset signal, and said mode selecting means comprises:
a second MOS transistor having source and drain electrodes disposed between said first power source and said inverter output mode;
first means for providing, and for interrupting, an electrical connection between one of said source and drain electrodes of said second MOS transistor and said first power source;

second means for providing, and for interrupting, a second electrical connection between the other of said source and drain electrodes of said second MOS transistor and said inverter output node; and a third MOS transistor having source and drain electrodes coupled between a gate electrode of said second MOS transistor and said second power source terminal, and a gate electrode separated by said delaying means from said gate electrode of said first MOS transistor;

a fourth MOS transistor having source and drain electrodes coupled between said first power source terminal and an input node;

an inverter coupled between a gate electrode of said fourth MOS transistor and said gate electrode of said second MOS transistor;

a fifth MOS transistor having source and drain electrodes coupled between said input node and said second power source terminal;

a sixth MOS transistor having source and drain electrodes coupled between said first power source terminal and said gate electrode of said second MOS transistor, and a gate electrode coupled to said input node;

a seventh MOS transistor having source and drain electrodes coupled between said gate electrode of said second MOS transistor and said second power source terminal, and a gate electrode coupled to said input node; and third means for providing, and for interrupting, a third electrical connection between said input node and said second power source terminal.

16. The mode selection signal generating circuit of claim 11, wherein said first latch means includes means coupled to said gate electrode of said first MOS transistor for delaying said reset signal, and said mode selecting means comprises:

a second MOS transistor having source and drain electrodes disposed between said first power source and said inverter output mode;

first means for providing, and for interrupting, an electrical connection between one of said source and drain electrodes of said second MOS transistor and said first power source;

second means for providing, and for interrupting, a second electrical connection between the other of said source and drain electrodes of said second MOS transistor and said inverter output node; and a third MOS transistor having source and drain electrodes coupled between a gate electrode of said second MOS transistor and said second power source terminal, and a gate electrode separated by said delaying means from said gate electrode of said first MOS transistor;

a fourth MOS transistor having source and drain electrodes coupled between said first power source terminal and an input node;

an inverter coupled between a gate electrode of said fourth MOS transistor and said gate electrode of said second MOS transistor;

a fifth MOS transistor having source and drain electrodes coupled between said input node and said second power source terminal;

a sixth MOS transistor having source and drain electrodes coupled between said first power source terminal and said gate electrode of said second MOS transistor, and a gate electrode coupled to said input node; and a seventh MOS transistor having source and drain electrodes coupled between said gate electrode of said second MOS transistor and said second power source terminal, and a gate electrode coupled to said input node.

17. The mode selection signal generating means of claim 10, wherein said first latch means comprises:

a first MOS transistor having source and drain electrodes coupled between said inverter output node and said second power source terminal, and a gate electrode provide a second output node;

a second MOS transistor having source and drain electrodes coupled between said first power source terminal and said second output node, and a gate electrode coupled to said inverter output node; and a third MOS transistor having source and drain electrodes coupled between said second output node and said second power source terminal, and a gate electrode coupled to said inverter output node.

18. The mode selection signal generating means of claim 11, wherein said first latch means comprises:

a second MOS transistor having source and drain electrodes coupled between said inverter output node and said second power source terminal, and a gate electrode provide a second output node;

a third MOS transistor having source and drain electrodes coupled between said first power source terminal and said second output node, and a gate electrode coupled to said inverter output node; and a fourth MOS transistor having source and drain electrodes coupled between said second output node and said second power source terminal, and a gate electrode coupled to said inverter output node.

19. The mode selection signal generating means of claim 15 wherein said first latch means comprises:

a eighth MOS transistor having source and drain electrodes coupled between said inverter output node and said second power source terminal, and a gate electrode provide a second output node;

a ninth MOS transistor having source and drain electrodes coupled between said first power source terminal and said second output node, and a gate electrode coupled to said inverter output node; and a tenth MOS transistor having source and drain electrodes coupled between said second output node and said second power source terminal, and a gate electrode coupled to said inverter output node.

20. A mode selecting circuit for semiconductor memory devices, comprising:

means coupled between a first output node and a reference potential terminal, for providing a first input node for receiving a reset signal, and for delaying said reset signal;

mode selecting means having a second input node, for selecting an operational mode by enabling one or more connections between a first power source terminal and said first output node, for responding to said reset signal by maintaining a high state at said first output node when said second input node is not coupled to said reference potential terminal, and for maintaining said first output node at a low state when said second input node is coupled to said second input node; and first latch means coupled to said first output node, for latching an output signal at a second output node in a low state when said first output node is at said high state, and for responding to application of said reset signal to said inverting means by latching said output signal at said second output node in a high state when said first output node is at said low state.

* * * * *

UNITED STATES PATENT AND TRADEMARK OFFICE
CERTIFICATE OF CORRECTION

PATENT NO. : 4,987,325  
DATED : January 22, 1991  
INVENTOR(S) : Seong-Mo Seo

Page 1 of 2

It is certified that error appears in the above-indentified patent and that said Letters Patent is hereby corrected as shown below:

| | | |
|---|---|---|
| Column 1, | Line 23, | Change "station" to --static-- ; |
| | Line 26, | Preceding "DRAM", Insert --a-- ; |
| | Line 27, | After "provides", Delete "makes" ; |
| | Line 39, | After "such", Delete "an" ; |
| | Line 45, | After "that", Delete "the" ; |
| | Line 55, | Change "device" to --devices-- ; |
| Column 3, | Line 16, | Delete "to consist" ; |
| | Line 42, | Delete "said" ; |
| Column 4, | Line 9, | Change "tho" to --the-- ; |
| | Line 36, | Change "Dower" to --power-- ; |
| | Line 40, | After "includes", Delete "of" ; |
| Column 6, | Line 36, | Change "means 16" to --15-- ; |
| | Line 60, | Change "code" to --mode-- ; |
| | Line 66, | Change "resetted" to --reset-- . |

UNITED STATES PATENT AND TRADEMARK OFFICE
CERTIFICATE OF CORRECTION

PATENT NO. : 4,987,325
DATED : January 22, 1991
INVENTOR(S) : Seong-Mo Seo

It is certified that error appears in the above-indentified patent and that said Letters Patent is hereby corrected as shown below:

Column 10, Line 66, Change "mode" to --node--.

Signed and Sealed this

Fifteenth Day of October, 1996

Attest:

BRUCE LEHMAN

*Attesting Officer*   *Commissioner of Patents and Trademarks*